(12) United States Patent
Kwon et al.

(10) Patent No.: US 10,983,560 B2
(45) Date of Patent: Apr. 20, 2021

(54) METHOD OF BENDING FLEXIBLE DISPLAY PANEL

(71) Applicant: Samsung Display Co., Ltd., Yongin-si (KR)

(72) Inventors: Ohjune Kwon, Hwaseong-si (KR); Seungyong Song, Suwon-si (KR); Jeongdo Yang, Yongin-si (KR); Seung-Hwa Ha, Hwaseong-si (KR); Sanghyeon Song, Seoul (KR); Jungyun Jo, Namyangju-si (KR); Jeongho Hwang, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 278 days.

(21) Appl. No.: 15/964,368

(22) Filed: Apr. 27, 2018

(65) Prior Publication Data

US 2018/0246544 A1 Aug. 30, 2018

Related U.S. Application Data

(62) Division of application No. 15/348,980, filed on Nov. 11, 2016, now Pat. No. 9,977,466.

(30) Foreign Application Priority Data

Sep. 22, 2016 (KR) .......................... 10-2016-0121691

(51) Int. Cl.
G06F 1/16 (2006.01)
H01L 51/00 (2006.01)
G09G 5/00 (2006.01)

(52) U.S. Cl.
CPC ............ *G06F 1/1652* (2013.01); *G09G 5/00* (2013.01); *H01L 51/0097* (2013.01); *H01L 2251/5338* (2013.01); *Y02E 10/549* (2013.01)

(58) Field of Classification Search
CPC . G06F 1/1652; G09G 5/00; H01L 2251/5338; H01L 51/0097; Y02E 10/549
See application file for complete search history.

(56) References Cited

U.S. PATENT DOCUMENTS

| | | | |
|---|---|---|---|
| 9,977,466 B2 * | 5/2018 | Kwon | H01L 51/0097 |
| 2006/0273304 A1 * | 12/2006 | Cok | H01L 51/524 |
| | | | 257/40 |

(Continued)

FOREIGN PATENT DOCUMENTS

| | | |
|---|---|---|
| EP | 3051333 | 8/2016 |
| KR | 10-1306521 | 9/2013 |

(Continued)

OTHER PUBLICATIONS

Extended European Search Report dated Feb. 19, 2018, in European Patent Application No. 17188020.6.

(Continued)

*Primary Examiner* — Minh N Trinh
(74) *Attorney, Agent, or Firm* — H.C. Park & Associates, PLC

(57) ABSTRACT

A method of bending a flexible display panel including a flexible substrate extending from a display area to a non-display area and a support layer disposed on the flexible substrate in the display area and the non-display area, the method including altering, via thermal deformation, a property of a material of the support layer disposed on the flexible substrate in the non-display area of the flexible display panel; and bending, after altering the property, a portion of the support layer in non-display area that extends from a plane of the support layer in the display area of the flexible display panel.

8 Claims, 12 Drawing Sheets

(56) References Cited

U.S. PATENT DOCUMENTS

| | | |
|---|---|---|
| 2007/0176309 A1 | 8/2007 | Kanbayashi |
| 2014/0024098 A1 | 1/2014 | Dodge et al. |
| 2014/0140020 A1 | 5/2014 | Rogers et al. |
| 2014/0240933 A1 | 8/2014 | Lee et al. |
| 2014/0307396 A1 | 10/2014 | Lee |
| 2015/0036300 A1 | 2/2015 | Park et al. |
| 2016/0093685 A1 | 3/2016 | Kwon et al. |
| 2016/0145138 A1 | 5/2016 | Lee et al. |
| 2018/0246544 A1* | 8/2018 | Kwon ................. H01L 51/0097 |

FOREIGN PATENT DOCUMENTS

| | | |
|---|---|---|
| KR | 10-2014-0104166 | 8/2014 |
| KR | 10-2014-0108825 | 9/2014 |
| KR | 10-2014-0108826 | 9/2014 |
| KR | 10-2014-0108827 | 9/2014 |
| KR | 10-2014-0122595 | 10/2014 |
| KR | 10-2014-0122597 | 10/2014 |
| KR | 10-2015-0014713 | 2/2015 |
| KR | 10-2015-0077121 | 7/2015 |
| KR | 10-2016-0063480 | 6/2016 |

OTHER PUBLICATIONS

Notice of Allowance dated Jan. 19, 2018, in U.S. Appl. No. 15/348,980.

* cited by examiner

METHOD OF BENDING FLEXIBLE DISPLAY PANEL

CROSS-REFERENCE TO RELATED APPLICATION

This application a Division of U.S. patent application Ser. No. 15/348,980, filed on Nov. 11, 2016, now U.S. Pat. No. 9,977,466 and claims priority from and the benefit of Korean Patent Application No. 10-2016-0121691, filed on Sep. 22, 2016, which is hereby incorporated by reference for all purposes as if fully set forth herein.

BACKGROUND

Field

Exemplary embodiments relate to display technology, and, more particularly, to flexible display panels and methods of bending the same.

DISCUSSION

Display devices have become iconographies of modern information consuming societies. Whether in the form of a cellular phone, consumer appliance, portable computer, television, or the like, aesthetic and ergonomic appeal are as much design considerations as display quality and overall performance. As such, greater attention is being directed towards developing display devices with minimal to no bezel configurations. Flexible display panels capable of permanent deformation (e.g., bending) in areas outlying a display area, and, thereby, capable of reducing the planar surface area of these outlying areas, are gaining traction at least because such configurations also enable peripheral circuitry to remain proximate to the display area. It is noted, however, that as the bend radius of an outlying area decreases, an increasing amount of stress is applied to the bending area. This increase in stress may increase resistivity in and reduce reliability of, for example, signal lines extending between the display area and the peripheral circuitry configured to drive pixels of the display area. A need, therefore, exists for efficient, cost-effective techniques enabling flexible display panels to be permanently deformed at relatively small bend radii, but maintain sufficient levels of performance and reliability.

The above information disclosed in this Background section is only for enhancement of understanding of the background of the inventive concept, and, therefore, it may contain information that does not form the prior art that is already known to a person of ordinary skill in the art.

SUMMARY

One or more exemplary embodiments provide flexible display panels capable of permanent, reliable deformation of outlying areas peripheral to a display area.

One or more exemplary embodiments provide flexible apparatuses capable of permanent, reliable deformation of outlying areas peripheral to an active area.

One or more exemplary embodiments provide flexible apparatuses capable of permanent, reliable deformation of first areas peripheral to second areas.

One or more exemplary embodiments provide methods of bending flexible display panels that reduces stress in bending areas of the flexible display panels.

One or more exemplary embodiments provide methods of bending flexible apparatuses that reduces stress in bending areas of the flexible apparatuses.

Additional aspects will be set forth in the detailed description which follows, and, in part, will be apparent from the disclosure, or may be learned by practice of the inventive concept.

According to one or more exemplary embodiments, a flexible display panel includes a display area to display an image, and a non-display area disposed outside the display area. The non-display area includes a first portion and a second portion. The first portion extends from the display area, and includes a support layer disposed on a flexible substrate. The second portion extends from the first portion, and is bent from a plane of the first portion. A property of a material of the support layer in the first portion is different than the property of the material of the support layer in the second portion.

According to one or more exemplary embodiments, a method of bending a flexible display panel includes: altering, via thermal deformation, a property of a material of a support layer disposed on a flexible substrate in a non-display area of the flexible display panel; and bending, after altering the property, a portion of the non-display area from a plane of a display area of the flexible display panel, the non-display area extending from the display area.

According to one or more exemplary embodiments, a flexible apparatus includes an active area, and an inactive area disposed outside the active area. The inactive area includes a first portion and a second portion. The first portion extends from the active area, and includes a support layer disposed on a flexible substrate. The second portion extends from the first portion, and is bent from a plane of the first portion. A property of a material of the support layer in the first portion is different than the property of the material of the support layer in the second portion.

According to one or more exemplary embodiments, a flexible apparatus includes a first area, and a second area disposed outside the active area. The second area includes a first portion and a second portion. The first portion extends from the first area, and includes a support layer disposed on a flexible substrate. The second portion extends from the first portion, and is bent from a plane tangent a surface of the first portion. A property of a material of the support layer in the first portion is different than the property of the material of the support layer in the second portion.

According to one or more exemplary embodiments, a method of bending a flexible apparatus includes: altering, via thermal deformation, a property of a material of a support layer disposed on a flexible substrate in an inactive area of the flexible display panel; and bending, after altering the property, a portion of the inactive area from a plane of an active area of the flexible apparatus, the inactive area extending from the active area.

According to one or more exemplary embodiments, a method of bending a flexible apparatus includes: altering, via thermal deformation, a property of a material of a support layer disposed on a flexible substrate in a first area of the flexible display panel; and bending, after altering the property, a portion of the first area from a plane of a second area of the flexible apparatus, the second area extending from the first area.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
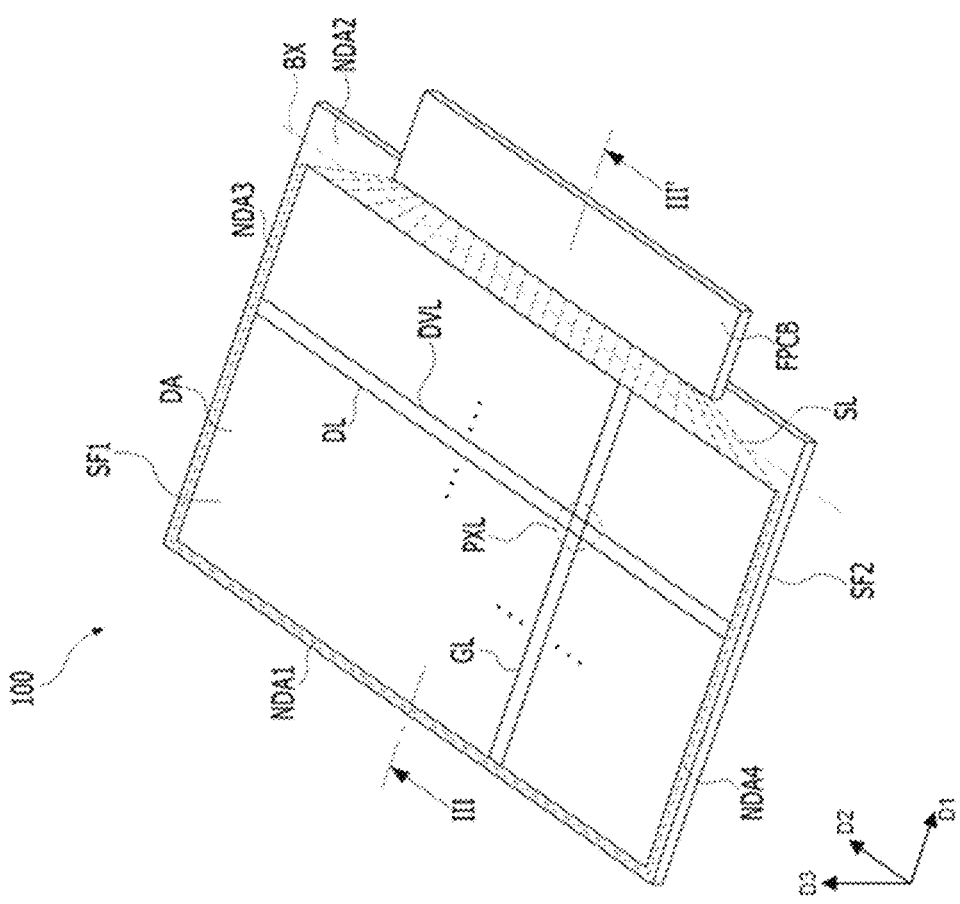
FIG. 1 is a perspective view of a flexible display panel in a non-bent state, according to one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, components, modules, layers, films, panels, regions, and/or aspects of the various illustrations may be otherwise combined, separated, interchanged, and/or rearranged without departing from the disclosed exemplary embodiments. Further, in the accompanying figures, the size and relative sizes of layers, films, panels, regions, etc., may be exaggerated for clarity and descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. Further, the D1-axis, the D2-axis, and the D3-axis are not limited to three axes of a rectangular coordinate system, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," "overlapping," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

According to one or more exemplary embodiments, a flexible display panel refers to a display panel having various degrees of flexibility, and may have the same meaning as a bendable display panel, a rollable display panel, a foldable display panel, a twistable display panel, and the like.

Although various exemplary embodiments are described with respect to flexible organic light emitting display panels, it is contemplated that various exemplary embodiments are also applicable to other flexible display panels, such as flexible liquid crystal display panels, flexible inorganic electroluminescent display panels, flexible field emission display panels, flexible plasma display panels, flexible electrophoretic display panels, flexible electrowetting display panels, and the like. Further, although various exemplary embodiments are described with respect to flexible display panels incorporated as part of a mobile phone, exemplary embodiments are also applicable to other electronic devices incorporating a flexible display panel, such as televisions, media players, notebook computers, gaming devices, tablets, monitors, navigational aids, pendant devices, billboards, wrist watches, headphones, earpiece devices, consumer appliances, etc. It is also contemplated that exemplary embodiments are applicable to configuring other flexible devices, such as configuring flexible light receiving components of, for instance, photovoltaic cells, configuring flexible touch screen devices, etc.

Figure 2:
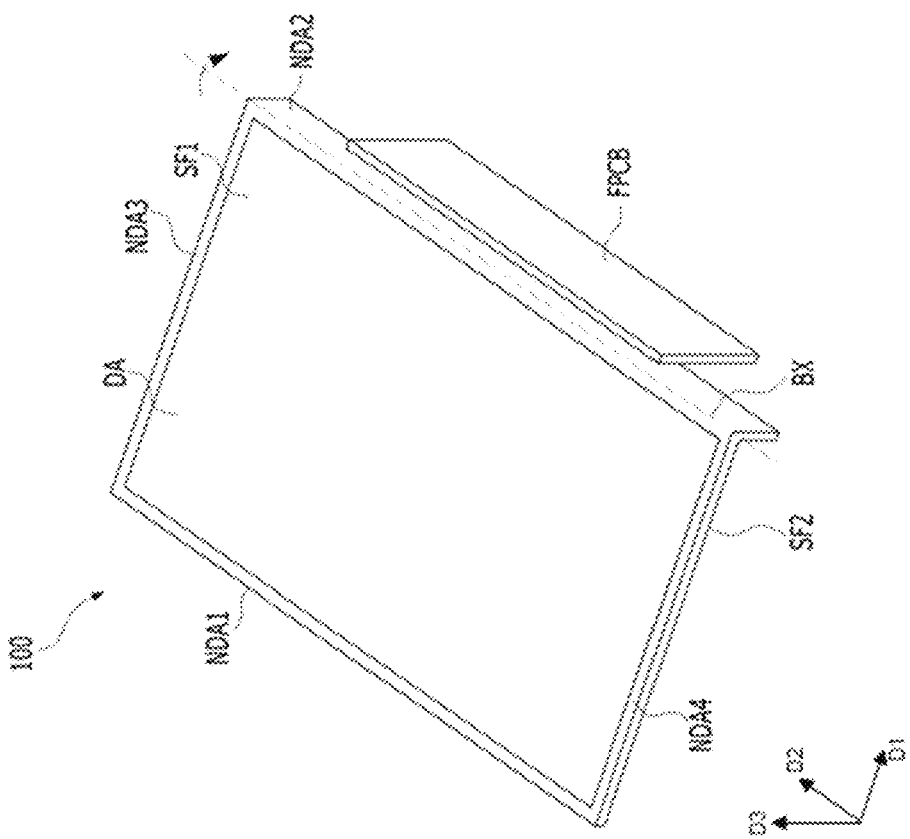
FIG. 2 is a perspective view of the flexible display panel of FIG. 1 in a first bent state, according to one or more exemplary embodiments.
Figure 3:
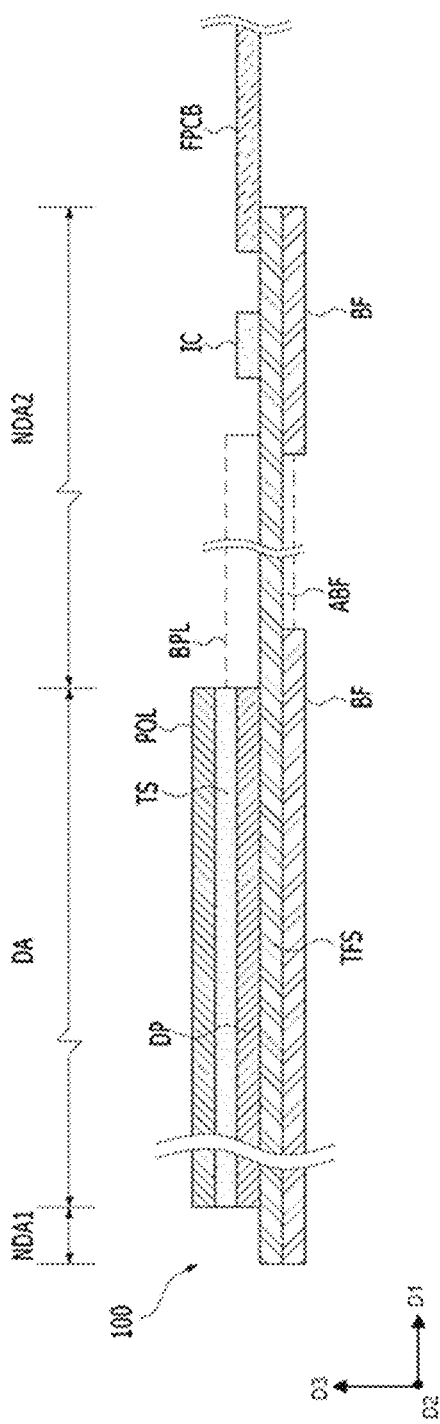
FIG. 3 is a cross-sectional view of the flexible display panel of FIG. 1 taken along sectional line III-III', according to one or more exemplary embodiments.
Figure 4A:
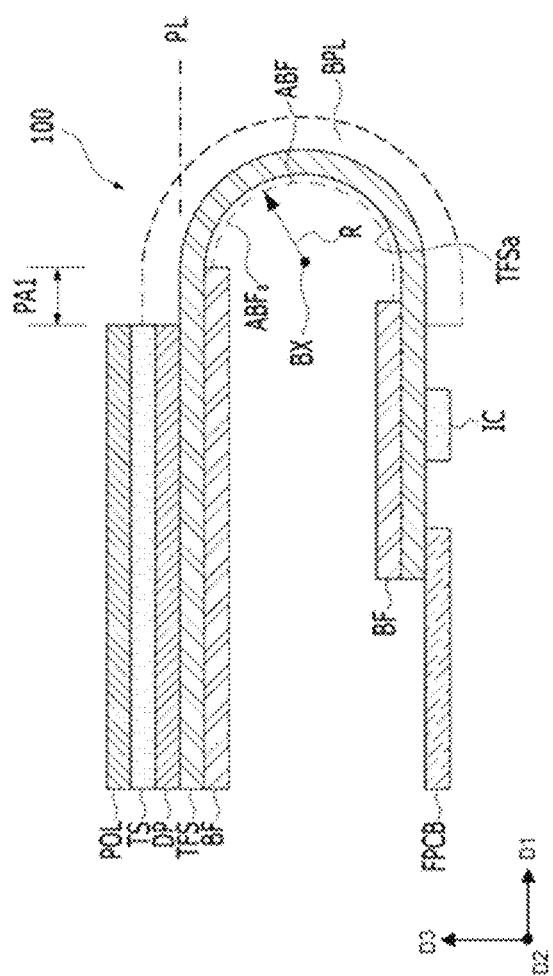
FIGS. 4A and 4B are cross-sectional views of the flexible display panel of FIG. 1 taken along sectional line III-III' in a second bent state, according to various exemplary embodiments.

FIG. 1 is a perspective view of a flexible display panel in a non-bent state, according to one or more exemplary embodiments. FIG. 2 is a perspective view of the flexible display panel of FIG. 1 in a first bent state, according to one or more exemplary embodiments. FIG. 3 is a cross-sectional view of the flexible display panel of FIG. 1 taken along sectional line III-III', according to one or more exemplary embodiments. FIG. 4A is a cross-sectional view of the flexible display panel of FIG. 1 taken along sectional line III-III' in a second bent state, according to one or more exemplary embodiments.

Referring to FIGS. 1-3 and 4A, flexible display panel 100 includes flexible substrate TFS upon which display panel layer DP, touch screen layer TS, and anti-reflection layer POL may be disposed. To this end, flexible substrate TFS may be disposed on support layer BF, which may also be referred to as a backfilm layer. One or more components, such as integrated circuit IC and flexible printed circuit board FPCB, may be coupled to (or otherwise formed on) flexible substrate TFS. To this end, flexible display panel 100 may also include bending protection layer BPL. Although specific reference will be made to this implementation, it is also contemplated that flexible display panel 100 may embody many forms and include multiple and/or alternative components. For example, it is contemplated that one or more components of flexible display panel 100 may be combined, formed as part of separate structures, etc.

For descriptive convenience, a surface of flexible display panel 100 on which an image may be perceived, will be referred to as first (or front) surface SF1. An opposite surface of flexible display panel 100 will be referred to as second (or back) surface SF2.

According to one or more exemplary embodiments, flexible display panel 100 may be incorporated as part of an electronic device (not shown), such as a mobile phone. In this manner, the electronic device may include a housing (not illustrated) configured to support at least a portion of flexible display panel 100 and one or more other components of the electronic device, such as one or more drivers, which may be electrically connected to (or interface with) flexible display panel 100 via, for instance, integrated circuit IC and/or flexible printed circuit board FPCB. The housing may be formed of any suitable material, such as plastics, glasses, ceramics, composites, metals, or other materials, or a combination thereof. As such, the housing may have a unibody configuration or may be formed from multiple structures.

For descriptive and illustrative convenience, flexible display panel 100 will be described as a flexible organic light emitting diode (OLED) display panel, however, exemplary embodiments are not limited thereto or thereby. In this manner, display panel layer DP may be an OLED display panel layer, or any other suitable display panel layer. As seen in FIGS. 3 and 4A, flexible display panel 100 may include touch sensor layer TS. The touch sensor layer TS may be formed as any suitable touch sensitive layer, such as a capacitive touch sensor layer, a resistive touch sensor layer, a surface acoustic wave touch sensor layer, an infrared touch sensor layer, a near field imaging touch sensor layer, etc. As such, flexible display panel 100 may provide a touch screen feature. Flexible display panel 100 may also include anti-reflection layer POL, which may be configured to darken an image displayed via display panel layer DP, manage reflection of ambient light, suppress glare, and/or the like. In this manner, anti-reflection layer POL may protect display panel layer DP from ambient light or at least reduce the effect of ambient light on the display quality of display panel layer DP.

Although illustrated as separate layers, touch sensor layer TS and/or anti-reflection layer POL may be incorporated as part of another layer of flexible display panel 100, such as part of display panel layer DP. For instance, touch sensor layer TS may be formed on a thin-film encapsulation layer (not shown) of display panel layer DP that covers, for instance, an electroluminescence layer (not illustrated) of display panel layer DP configured to emit light as part of displaying an image via flexible display panel 100. It is also contemplated that at least one of touch sensor layer TS and anti-reflection layer POL may be provided as a separate module coupled to display panel layer DP.

According to one or more exemplary embodiments, flexible display panel 100 is a deformable (e.g., bendable, foldable, flexible, etc.) display panel including flexible substrate TFS on which display panel layer DP is disposed. Flexible substrate TFS may be formed of a thermoset material, however, exemplary embodiments are not limited thereto or thereby. In other words, flexible substrate TFS may be formed of any suitable material. For instance, flexible substrate TFS may be formed of polyimide (PI) having a decomposition temperature around 452° C. when heat is continuously applied and around 704° C. when heat is applied in relatively short bursts. In one or more exemplary embodiments, the material configuration of flexible substrate TFS may exhibit a higher melting and/or sublimating temperature than a material configuration of supporting layer BF.

Display panel layer DP is configured to display an image by combining light from pixels (e.g., pixel PXL) disposed in display area DA of flexible display panel 100. Display area DA may also correspond to an active area, such as an active area of display panel layer DP, an active area of touch sensing layer TS, etc. In this manner, the active area may be a region in which a function of flexible display panel 100 is provided to a user, such as a display function, a touch sensing function, etc. For descriptive and illustrative convenience, display area DA and the active area may be referred to as display area DA. Pixels PXL may be arranged in any suitable formation, such as a matrix formation, in at least the display area DA. One or more non-display areas (e.g., non-display areas NDA1, NDA2, NDA3, and NDA4) may be disposed outside of display area DA. The one or more non-display areas may also correspond to an inactive area, such as an inactive area of display panel layer DP, an inactive area of touch sensing layer TS, etc. In this manner, the inactive area may be a region in which the function provided in display area DA is not provided. For descriptive and illustrative convenience, the one or more non-display areas (e.g., non-display areas NDA1, NDA2, NDA3, and NDA4) and the inactive area may be referred to as non-display areas.

The one or more non-display areas may include first non-display area NDA1, second non-display area NDA2, third non-display area NDA3, and fourth non-display area NDA4. It is noted that first to fourth non-display areas NDA1 to NDA4 may surround display area DA, but are at least disposed outside of (or adjacent to) display area DA. As seen in FIGS. 1 and 2, first non-display area NDA1 and second non-display area NDA2 are spaced apart from one another and face one another when flexible display panel 100 is viewed in a plan view, e.g., when viewed in direction D3. To this end, third non-display area NDA3 and fourth non-display area NDA4 may be respectively adjacent to first non-display area NDA1 and second non-display area NDA2. Third non-display area NDA3 and fourth non-display area NDA4 may be spaced apart from one another and face one another when flexible display panel 100 is viewed in a plan view. One or more portions of first to fourth non-display areas NDA1 to NDA4 may be covered by an opaque masking material (not illustrated), such as a light blocking layer formed of, for instance, a polymer including carbon black pigmentation, a layer of opaque metal material, and/or the like. The light blocking layer may help conceal components disposed in association with at least one of first to fourth non-display areas NDA1 to NDA4.

According to one or more exemplary embodiments, pixels PXL may be driven, at least in part, via at least one of a main driver (not shown), a gate driver (not illustrated), a data driver (not shown), and a power source (not illustrated). At least one of the main driver, the gate driver, the data driver, and the power source may be coupled to (or integrated as part of) flexible printed circuit board FPCB and/or integrated circuit IC.

For instance, the data driver and/or the gate driver may be coupled to a surface of a non-display area of flexible display panel 100 via a chip-on-plastic (COP) technique or a chip-on-film (COF) technique (the film being, for example, a flexible film), and the main driver may be disposed on flexible printed circuit board FPCB. In one or more exemplary embodiments, a COP technique may include mounting an integrated circuit forming a driving circuit (e.g., the data driver, the gate driver, etc.) on flexible substrate TFS via a conductive film (not illustrated), such as an anisotropic conductive film. A COF technique may, for example, include mounting an integrated circuit forming a driving circuit (e.g., the data driver, the gate driver, etc.) on a film (not shown), the film being utilized to couple flexible printed circuit board FPCB to flexible substrate TFS. It is noted that the main driver may be connected to the data driver and the gate driver via signal lines SL. Flexible printed circuit board FPCB may include a flexible printed circuit and a multilayer printed circuit board; however, exemplary embodiments are not limited thereto or thereby. As another example, the data driver and/or the gate driver may be coupled to a non-display area of flexible display panel 100 via a tape-automated bonding (TAB) method. In this manner, the main driver, the gate driver, and the data driver may be disposed on flexible printed circuit board FPCB, and, thereby, be electrically connected to one another. For instance, flexible printed circuit board FPCB may include a tape carrier package (TCP) on which the data driver and/or the gate driver may be mounted, and a multilayer printed circuit board on which the main driver may be mounted. The multilayer printed circuit board may be connected to the TCP. Also, the power source (e.g., an external power source) may be connected to the main driver.

According to one or more exemplary embodiments, signal lines SL may extend between pixels PXL and at least one of the main driver, the gate driver, the data driver, and the power source. It is also contemplated that one or more of signal lines SL may be connected to one or more pixels PXL, but not connected to at least one of the main driver, the gate driver, the data driver. In this manner, signal lines SL may generally be disposed in at least one of first to fourth non-display areas NDA1 to NDA4 and extend into display area DA. Although signal lines SL are illustrated as crossing bending axis BX at various angles, it is contemplated that signal lines SL may extend across bending axis BX in first direction D1, e.g., in a direction perpendicular to bending axis BX. Further, signal lines SL may be connected to or form signal lines disposed in display area DA, such as gate lines GL, data lines DL, and data voltage lines DVL. As such, pixels PXL may display an image based on signals received via the main driver, the gate driver, the data driver, and the power source. An equivalent circuit of a representative pixel is described in more detail in association with FIG. 5.

Figure 5:
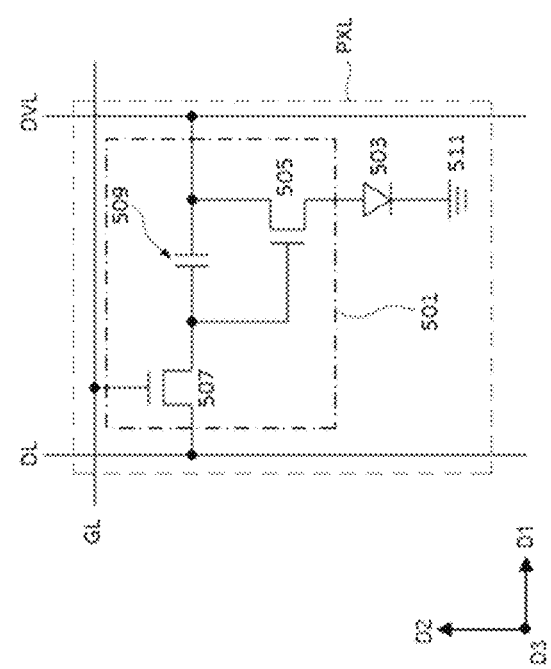
FIG. 5 is an equivalent circuit diagram of a pixel of the flexible display panel of FIG. 1, according to one or more exemplary embodiments.

FIG. 5 is an equivalent circuit diagram of a pixel of the flexible display panel of FIG. 1, according to one or more exemplary embodiments. It is noted that pixel PXL of FIG. 5 is representative of the various pixels of flexible display panel 100.

With continued reference to FIG. 1, pixel PXL may include pixel circuit 501 connected to gate line GL extending in first direction D1, data line DL extending in second direction D2, and driving voltage line DVL also extending in second direction D2. Second direction D2 may cross first direction D1. To this end, first and second directions D1 and D2 may cross third direction D3. It is also noted that organic light emitting diode 503 is connected to pixel circuit 501. As seen in FIG. 5, pixel circuit 501 includes driving thin film transistor (TFT) 505, switching TFT 507, and storage capacitor 509. Although reference will be made to this implementation, it is also contemplated that pixel circuit 501 may embody many forms and include multiple and/or alternative components and configurations. For instance, pixel circuit 501 may include any suitable number of thin film transistors and any suitable number of storage capacitors. As such, the equivalent circuit diagram of FIG. 5 is merely illustrative; exemplary embodiments are not limited thereto or thereby. In this manner, any suitable pixel circuit may be utilized in association with exemplary embodiments.

In one or more exemplary embodiments, switching TFT 507 includes a first electrode connected to gate line GL, a second electrode connected to data line DL, and a third electrode connected to a first electrode of storage capacitor 509 and a first electrode of driving TFT 505. In this manner, switching TFT 507 is configured to transfer a data signal Dm received via data line DL to driving TFT 505 in response to a scan signal Sn received via gate line GL. As previously mentioned, the first electrode of storage capacitor 509 is connected to the third electrode of switching TFT 507. A second electrode of storage capacitor 509 is connected to driving voltage line DVL and a second electrode of driving TFT 505. As such, storage capacitor 509 is configured to store a voltage corresponding to a difference between a voltage received via switching TFT 507 and a driving voltage ELVDD received via driving voltage line DVL.

The second electrode of driving TFT 505 is connected to driving voltage line DVL and the second electrode of storage capacitor 509. Driving TFT 505 also includes a first electrode connected to the third electrode of switching TFT 507 and a third electrode connected to a first electrode of organic light emitting diode 503. In this manner, driving TFT 505 is configured to control a driving current through organic light emitting diode 503 from driving voltage line DVL in response to the voltage value stored in storage capacitor 509.

The organic light emitting diode 503 includes a first electrode connected to the third electrode of driving TFT 505 and a second electrode connected to common power voltage 511, e.g., a common power voltage ELVSS. As such, organic light emitting diode 503 may emit light at a determined brightness (and, in one or more exemplary embodiments, a determined color) according to the driving current received via driving TFT 505.

According to one or more exemplary embodiments, driving TFT 505 and switching TFT 507 may each include an active layer (not shown) disposed in association with the various electrodes of the corresponding thin film transistor. The active layer may be formed of any suitable semiconductor material. For example, the active layer may contain an inorganic semiconductor material, such as amorphous silicon or polysilicon crystallized from amorphous silicon. The active layer may contain an oxide semiconductor material, such as an oxide of a material selected from a group XII, XIII, or XIV element, such as zinc (Zn), indium (In), gallium (Ga), tin (Sn), cadmium (Cd), germanium (Ge), and hafnium (Hf), or combinations thereof. It is also noted that the active layer may be formed of a relatively low polymer-series or polymer-series organic material, such as mellocyanine, phthalocyanine, pentacene, thiophen, etc.

Although not illustrated, organic light emitting diode 503 may include a pixel electrode, an opposite electrode, and an intermediate layer disposed between the pixel electrode and the opposite electrode. The intermediate layer is configured to emit light according to a voltage difference across the pixel electrode and the opposite electrode. In this manner, the pixel electrode may function as the above-noted first electrode (e.g., an anode electrode) of organic light emitting diode 503, and the opposite electrode may function as the above-noted second electrode (e.g., cathode electrode) organic light emitting diode 503. It is contemplated, however, that the polarities of the pixel electrode and the opposite electrode may be reversed.

According to one or more exemplary embodiments, the pixel electrode and the opposite electrode are insulated from each other via the intermediate layer. An organic emission layer of the intermediate layer may emit light according to voltages of different polarities being applied to the intermediate layer. In this manner, the intermediate layer may include an organic emission layer. As another example, the intermediate layer may include the organic emission layer, and further include at least one layer selected from the group consisting of a hole injection layer (HIL), a hole transport layer (HTL), an electron transport layer (ETL), and an electron injection layer (EIL).

Although a light emitting material may be separately included in respective pixels PXL of the above-noted organic light emission layer, exemplary embodiments are not limited thereto or thereby. For example, the organic light emission layer may be a common organic light emission layer used for each pixel PXL regardless of its location. In one or more exemplary embodiments, the organic light emission layer may include light emitting materials to respectively emit red light, green light, and blue light, however, any other suitable color may be utilized in association with exemplary embodiments. The light emitting materials may be stacked in a vertical direction or disposed in a mixed manner. The light emitting materials may include materials to emit a combination of different colors. The combination of different colors may be utilized to form white light. Although not illustrated, a color conversion layer or a color filter may be included to convert the emitted white light to a certain color.

Adverting back to FIGS. 1-3 and 4A, flexible display panel 100 may further include supporting layer BF, which may be coupled to (or formed on) flexible substrate TFS after a carrier substrate (not shown) is removed as part of manufacturing flexible display panel 100. An exemplary process of forming flexible display panel 100 including utilization of a carrier substrate will be described in more detail in association with FIG. 6. Supporting layer BF may be formed of a thermoplastic material, such as a thermoplastic resin, however, exemplary embodiments are not limited thereto or thereby. In other words, supporting layer BF may be formed of any suitable material. For instance, supporting layer BF may be formed of polyethylene (PE), polystyrene (PS), polyethylene terephthalate (PET), polyvinyl chloride (PVC), polyethylene naphthalate (PEN), etc. As such, supporting layer BF may exhibit a melting point, as well as a decomposition point. For instance, supporting layer BF may be formed of PET exhibiting a melting point around 250° C. and a decomposition temperature around 350° C. In this manner, the material configuration of supporting layer BF may exhibit a lower melting and/or sublimating temperature than a material configuration of flexible substrate TFS. It is also noted that supporting layer BF may be coupled to flexible substrate TFS via any suitable technique, whether mechanical, chemical, etc. For example, supporting layer BF may be coupled to flexible substrate TFS via optically clear adhesive (OCA), pressure sensitive adhesive (PSA), and/or the like.

According to one or more exemplary embodiments, supporting layer BF may include a first portion exhibiting first material properties and a second portion exhibiting second material properties, as will become more apparent below. The differences in material properties may be the result of thermally deforming a portion of supporting layer BF in association with one or more exemplary embodiments described herein. In general, however, it is noted that the differences in material properties between the first and second portions of supporting layer BF may relate to differences in density, hardness, surface roughness, color, etc. Further, the first and second portions of supporting layer BF may be different based on the presence of a charred surface, trapped bubbles (e.g., air bubbles), etc. Apart from differences in material properties, the first and second portions of supporting layer BF may be dimensionally different.

For example, as seen in FIGS. 3 and 4A, a thickness of supporting layer BF may be smaller (e.g., thinned) in supporting layer portion ABF, which may be omitted. When supporting layer portion ABF is omitted, first surface TFSa of flexible substrate TFS may be exposed in a portion of supporting layer BF that would otherwise correspond to supporting layer portion ABF. It is also noted that supporting layer portion ABF may correspond to or include a portion of supporting layer BF in which at least one material property of supporting layer BF has been modified via, for instance, thermal deformation, as will become more apparent below.

According to one or more exemplary embodiments, one or more of first to fourth non-display areas NDA1 to NDA4 (e.g., second non-display area NDA2) may be bent from plane PL tangent to a surface of display panel layer DP to, for example, enhance aesthetics of flexible display panel 100 when incorporated as part of an electronic device. In this manner, a portion of bent non-display areas (e.g., a portion of second non-display area NDA2) may be bent, such as about bending axis BX and under display panel layer DP to reduce a size and exposure of the non-display area when first surface SF1 of flexible display panel 100 is viewed in a plan view. For instance, a size and exposure of portion PA1 may be reduced by bending second non-display area NDA2 with respect to bending axis BX and plane PL. It is noted, however, that flexible display panel 100 may be bent at angles greater than 0 degrees and less than or equal to 360 degrees, e.g., at angles greater than 0 degrees and less than or equal to 270 degrees. Further, although only second non-display area NDA2 is illustrated as being bent, it is contemplated that one or more of first to fourth non-display areas NDA1 to NDA4 may be bent to reduce their respective sizes. To this end, a portion of display area DA may be bent in association with the bending of at least one of first to fourth non-display areas NDA1 to NDA4. In this manner, flexible display panel 100 may be bent to include a curved surface portion.

According to one or more exemplary embodiments, modification of supporting layer BF (e.g., via thermal deformation, via thermal deformation and dimensional alteration, etc.) may be utilized to reduce the amount of force to bend a non-display area of flexible display panel 100, and, thereby, to reduce the amount of stress generated when the non-display area is bent from plane PL. In this manner, reduction of the stress may reduce degradation of the structural integrity (e.g., reduce the potential for cracks, etc.) and performance (e.g., reduce the potential for increases in resistivity, etc.) of signal lines SL extending between pixels PXL and at least one of flexible printed circuit board FPCB and integrated circuit IC. Reduction of the stress may also enable a size of bending radius R of flexible display panel 100 to be reduced, and, thereby, enable an overall thickness of an electronic device incorporating flexible display panel 100 to be reduced. For instance, bending radius R may be greater than or equal to twice the aggregate thickness of flexible substrate TFS and supporting layer BF and less than or equal to 0.3 mm. Larger bending radii, however, may be utilized with exemplary embodiments.

Various techniques to modify features of supporting layer BF may be utilized, such as described in association with FIGS. 6, 7, 8A-8D, 9A-9C, 11, 12A, 12B, 13A-13C, 14A, 14B, 15A, 15B, 16A, 16B, 17, 18A, and 18B. In at least one of these techniques, a component utilized to effectuate the modification of the feature(s) of supporting layer BF may remain part of flexible display panel 100, such as described in association with FIG. 4B.

Figure 4B:
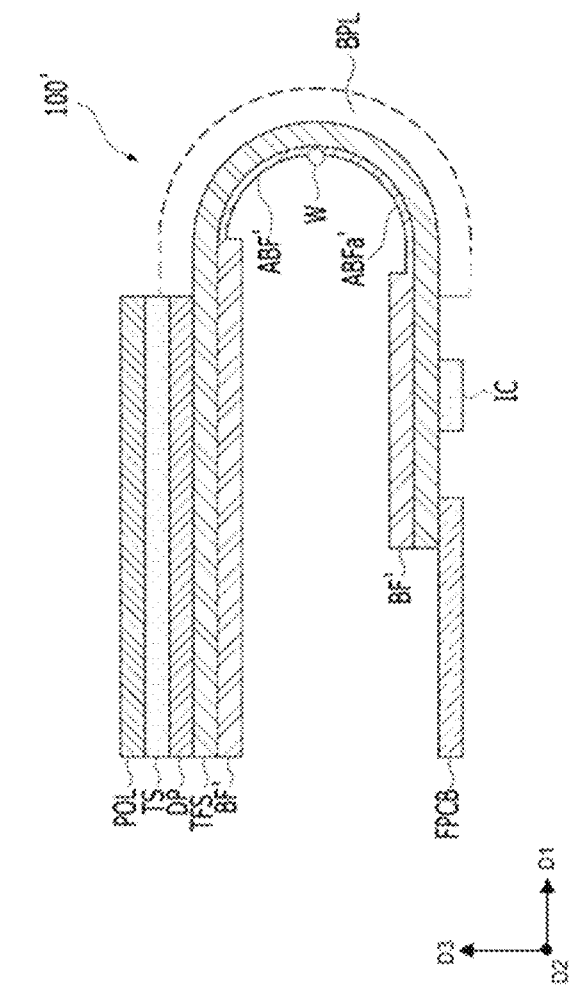

FIG. 4B is a cross-sectional view of the flexible display panel of FIG. 1 taken along sectional line III-III' in a second bent state, according to one or more exemplary embodiments. Flexible display panel 100' is similar to flexible display panel 100 of FIGS. 1-3 and 4A, and, as such, duplicative descriptions are primarily omitted to avoid obscuring exemplary embodiments.

As seen in FIG. 4B, supporting layer BF' includes wire W disposed in supporting layer portion ABF'. According to one or more exemplary embodiments, wire W may become part of flexible display panel 100' as a result of pressing wire W into a surface of supporting layer BF' to thermally deform a portion of supporting layer BF'. It is also contemplated that supporting layer BF' may be patterned, thermally conductive material may formed in patterned regions of supporting layer BF', and the thermally conductive material in the patterned regions may be heated to effectuate thermal deformation of supporting layer BF'. As will become more apparent below, wire W may be heated to alter a property of supporting layer BF', and, thereby, to facilitate bending of flexible display panel 100 with less force than would otherwise be required. Further, supporting layer portion ABF' may cover flexible substrate TFS, and, as such, surface ABFa' may be exposed instead of first surface TFSa of flexible substrate TFS.

With reference to FIGS. 4A and 4B, flexible display panels 100 and 100' may include bending protection layer BPL on a curved surface portion of flexible substrate TFS to protect the curved surface portion from, for example, external forces, impacts, effects of later occurring manufacturing processes, etc. It is noted, however, that bending protection layer BPL is optional, and, therefore, may be omitted. For instance, supporting layer portion ABF may sufficiently support and protect the structural integrity of the curved surface portion of flexible display panel 100, and, as such, bending protection layer BPL may be omitted. When utilized in association with supporting layer portion ABF, a thickness of bending protection layer BPL may be reduced, which may also reduce manufacturing costs and time. In one or more exemplary embodiments, a thickness of bending protection layer BPL may be greater than a thickness of display panel layer DP, however, exemplary embodiments are not limited thereto or thereby.

Figure 6:
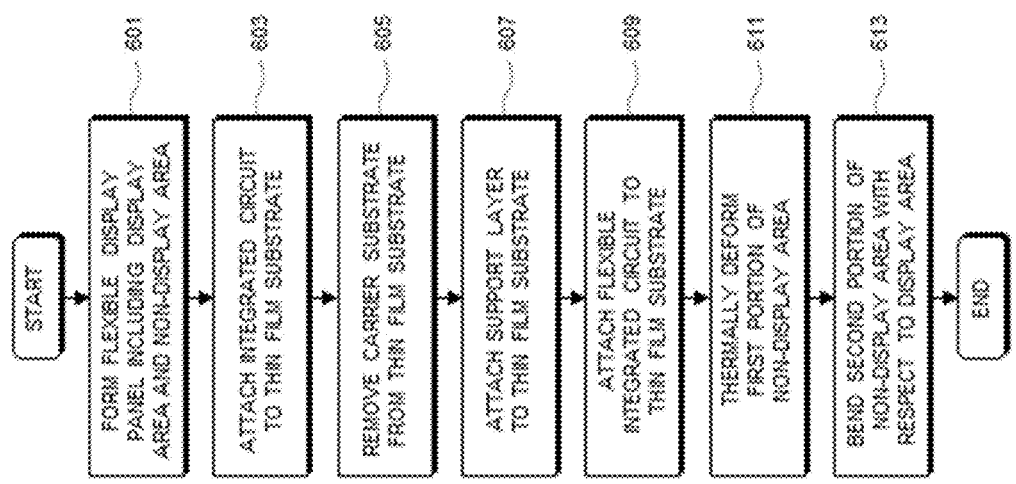
FIG. 6 is a flowchart of a process for forming a flexible display panel with at least one bent portion, according to one or more exemplary embodiments.

FIG. 6 is a flowchart of a process for forming a flexible display panel with at least one bent portion, according to one or more exemplary embodiments. The process of FIG. 6 will be described in association with FIGS. 1, 3, 4A, and 5. It is noted that the process of FIG. 6 will also be described in association with bending second non-display area NDA2, however, it is contemplated that one or more of first to fourth non-display areas NDA1 to NDA4 may be bent in association with exemplary embodiments.

In step 601, one or more display structures, such as thin-film transistor structures, storage capacitor structures, organic light-emitting diode structures, gate lines GL, data lines DL, data voltage lines DVL, signal lines SL, and the like, may be formed on flexible substrate TFS, which may be a polyimide layer attached to a carrier substrate (not shown), such as a glass carrier substrate. In this manner, flexible display panel 100 may be partially formed including display area DA and first to fourth non-display areas NDA1 to NDA4. At step 603, one or more integrated circuits (e.g., integrated circuit IC), which may include at least one driver configured to cause, at least in part, pixels PXL to display an image, may be coupled to flexible substrate TFS. For instance, integrated circuit IC may be coupled to flexible substrate TFS in second non-display area NDA2. The glass carrier substrate may be removed, e.g., delaminated, from flexible substrate TFS, per step 605. At step 607, supporting layer BF may be attached to flexible substrate TFS via, for instance, an OCA, a PSA, and/or the like. In step 609, flexible printed circuit board FPCB may be coupled to flexible substrate TFS via conductive adhesive.

According to one or more exemplary embodiments, a first portion of second non-display area NDA2 may be thermally deformed, per step 611. Thermal deformation of the first portion of second non-display area NDA2 may cause, at least in part, at least one property of the material of supporting layer BF to be altered in at least the first portion. For example, thermal deformation of the first portion of second non-display area NDA2 may cause, at least in part, a change in density, hardness, surface roughness, color, and/or the like, in at least the first portion of second non-display area NDA2. To this end, thermal deformation of the first portion may also cause, at least in part, a dimensional change to supporting layer BF in at least the first portion of second non-display area NDA2. In step 613, a second portion of second non-display area NDA2 that extends from the first portion of second non-display area NDA2 is bent with respect to display area DA. For example, the second portion of second non-display area NDA2 may be bent with respect to plane PL tangent to a surface of display area DA. To this end, the second portion of second non-display area NDA2 may be bent about bending axis BX, such that at least some of second non-display portion NDA2 is disposed under display area DA.

To reduce mechanical stress in flexible display panel 100 when, for instance, the second portion of second non-display area NDA2 is bent from display area DA, one or more techniques may be employed, e.g., "hot" bending techniques, "hot" bending and notching techniques, etc. For instance, flexible display panel 100 may be "hot" bent via a hot wire bending technique, described in more detail in association with FIGS. 7, 8A-8D, 9A-9C, and 10.

Figure 7:
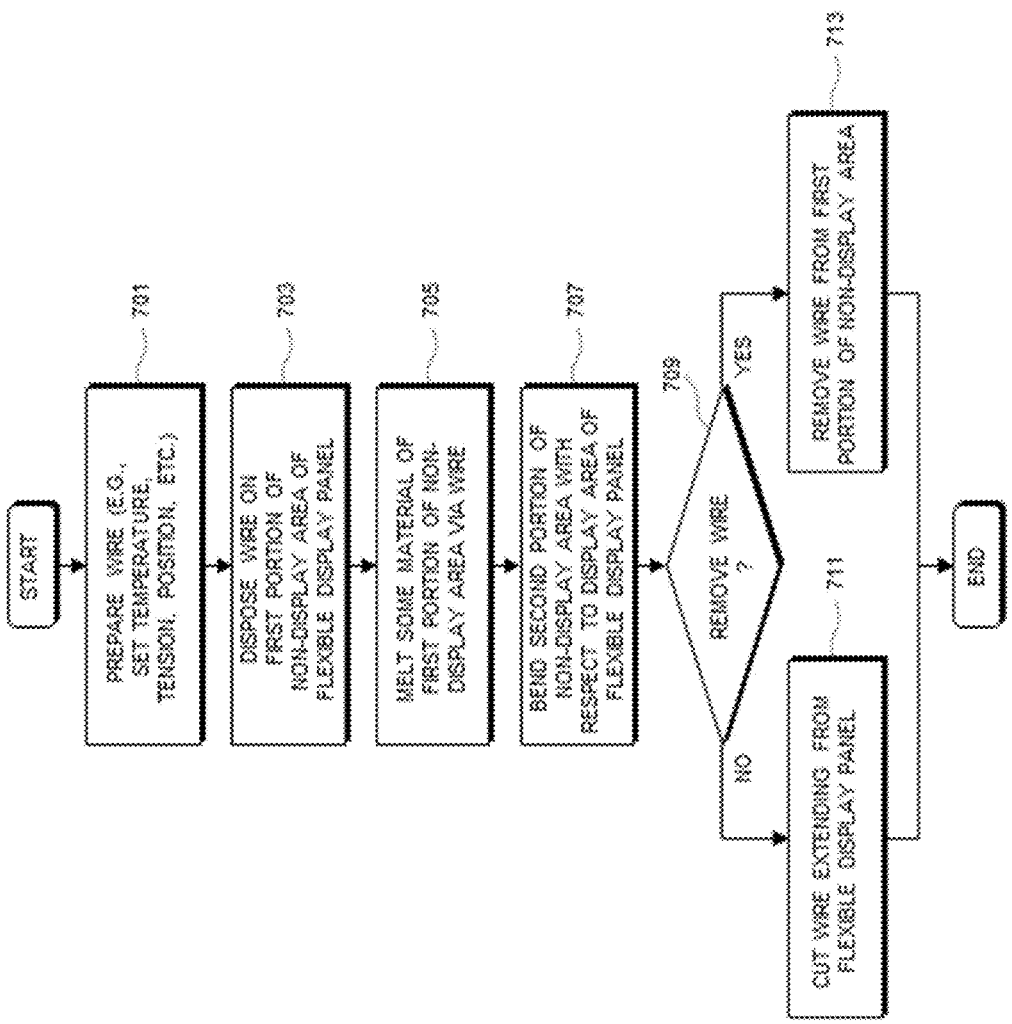
FIG. 7 is a flowchart of a process for bending a flexible display panel via a hot wire bending technique, according to one or more exemplary embodiments.
Figure 8C:
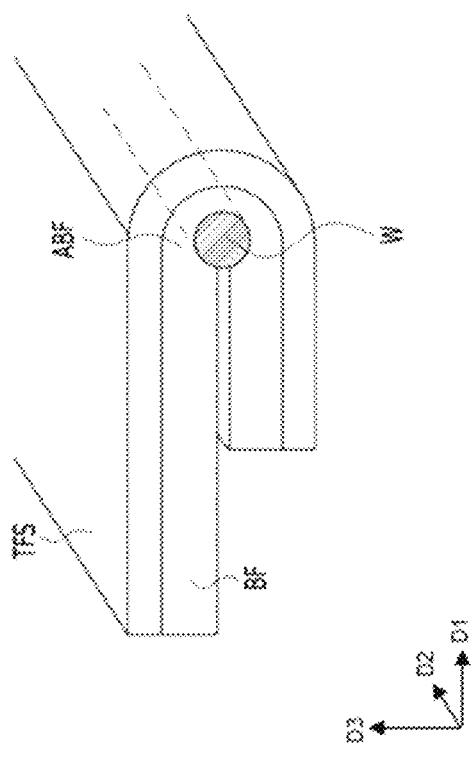
FIGS. 8A, 8B, 8C, and 8D are partial perspective views of a flexible display panel at various stages of being bent via a hot wire bending technique, according to one or more exemplary embodiments.
Figure 8D:
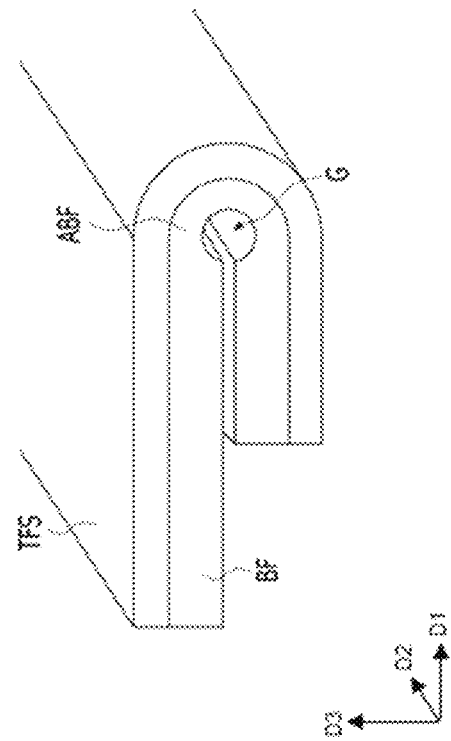
Figure 8A:
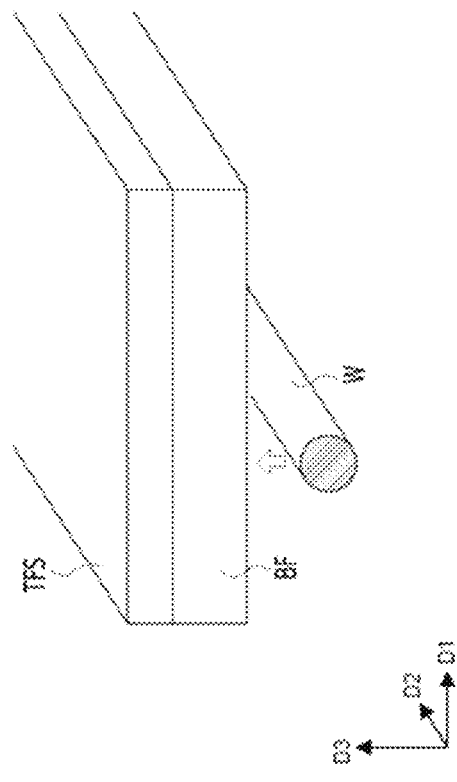
Figure 8B:
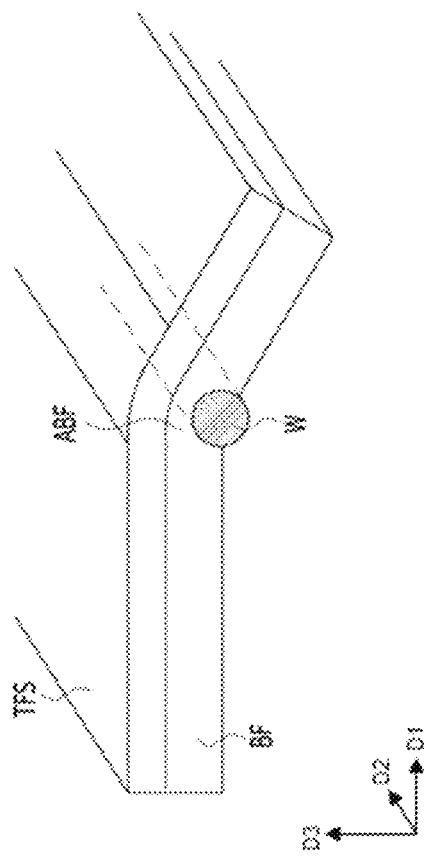
Figure 9A:
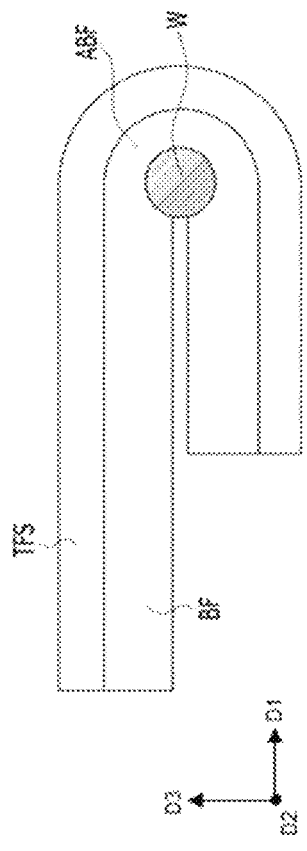
FIGS. 9A, 9B, and 9C are partial cross-sectional views of various hot wire configurations, according to one or more exemplary embodiments.
Figure 9B:
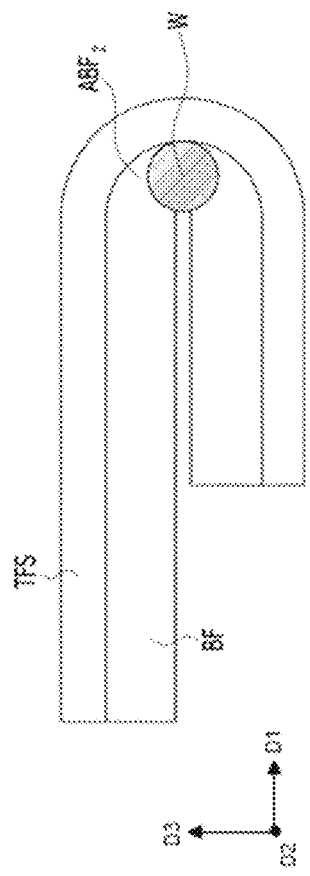
Figure 9C:
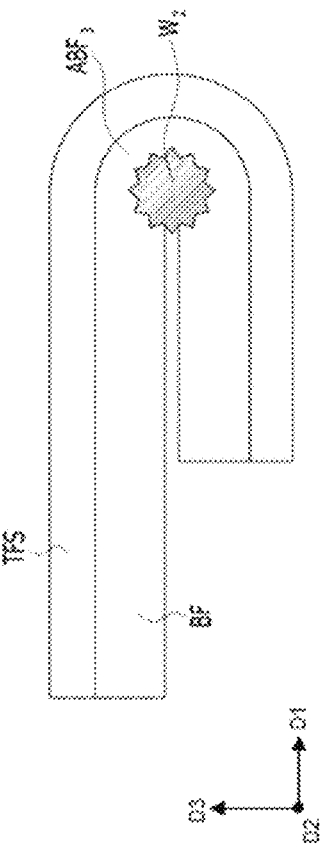
Figure 10:
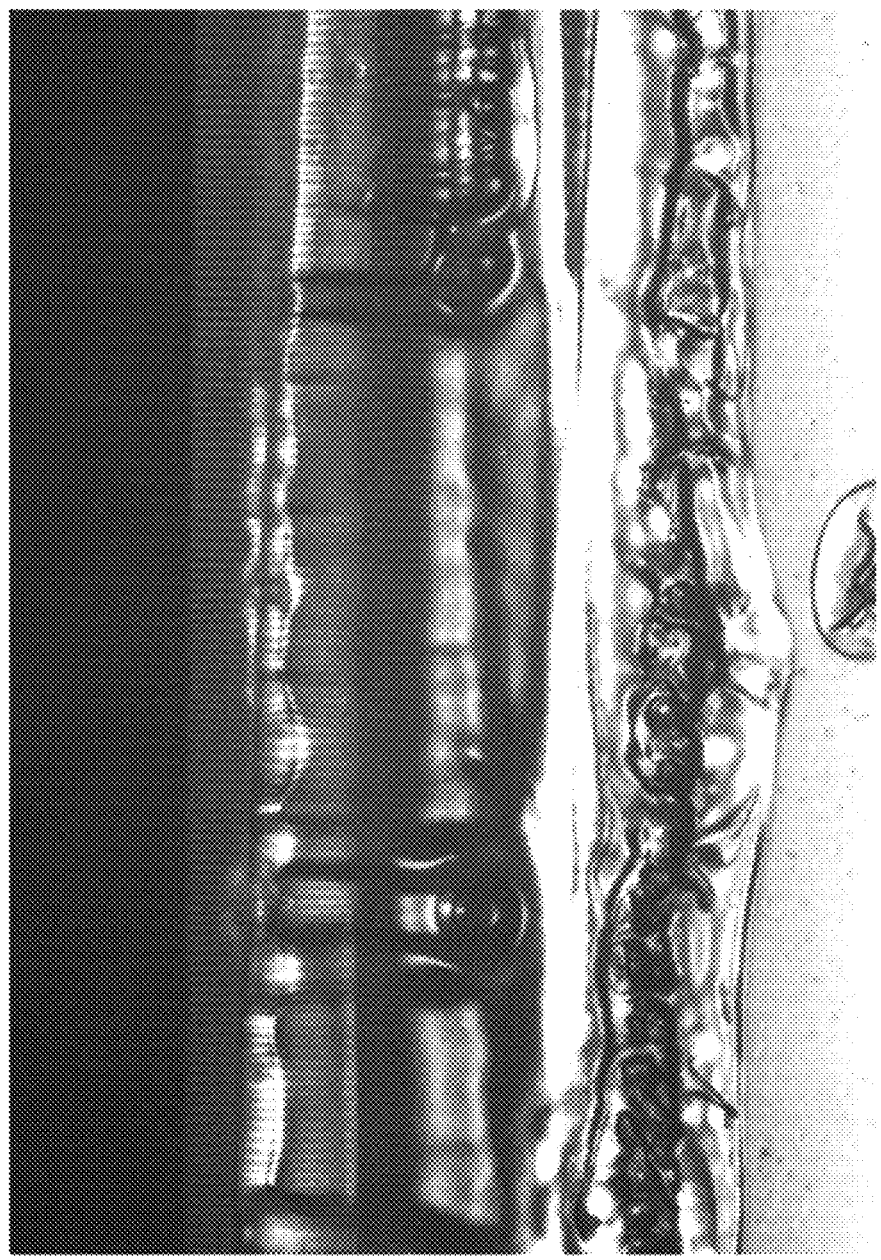
FIG. 10 illustrates material property alterations in a layer of a flexible display panel caused, at least in part, by a hot wire bending technique, according to one or more exemplary embodiments.

FIG. 7 is a flowchart of a process for bending a flexible display panel via a hot wire bending technique, according to one or more exemplary embodiments. FIGS. 8A, 8B, 8C, and 8D are partial perspective views of a flexible display panel at various stages of being bent via a hot wire bending technique, according to one or more exemplary embodiments. FIGS. 9A, 9B, and 9C are partial cross-sectional views of various hot wire configurations, according to one or more exemplary embodiments. FIG. 10 illustrates material property alterations in a layer of a flexible display panel caused, at least in part, by a hot wire bending technique, according to one or more exemplary embodiments.

At step 701, wire W is prepared for "hot" wire bending of flexible display panel 100. For example, a temperature of wire W is tensioned, elevated close to a melting temperature of a material of supporting layer BF, and positioned with respect to supporting layer BF, as seen in FIG. 8A. In one or more exemplary embodiments, the temperature of wire W is elevated only so high as to ensure the structural integrity of wire W when held under a modest amount of tension, such as greater than or equal to 1 N and less than or equal to 3 N, at an elevated temperature. In this manner, wire W may be formed of tungsten, however, any suitable thermally conductive material capable of being tensioned as previously mentioned at elevated temperatures may be utilized in association exemplary embodiments. When, for instance, supporting layer BF is formed of PET with a glass transition temperature around 76° C., a melting temperature around 250° C., and a decomposition temperature around 350° C., the temperature of wire W may be greater than or equal to 76° C. and less than or equal to 250° C. When the temperature of wire W is less than 76° C., the material of supporting layer BF may not transition into a liquid phase when wire W is disposed on (e.g., pressed against) supporting layer BF. When the temperature of wire W is greater than 250° C., the structural integrity of wire W may be compromised and break. It is also noted that when the temperature of wire W is greater than 250° C., at least one other component of flexible display panel 100 may be damaged. This may compromise the structural integrity of flexible display panel 100, as well as introduce at least one defect affecting display quality.

According to one or more exemplary embodiments, flexible substrate TFS may be formed of polyimide having a decomposition temperature around 452° C. when heat is applied continuously and a decomposition temperature around 704° C. when heat is applied in relatively short bursts of time. In this manner, polyimide may be considered a thermoset material that does not generally melt, but may decompose if sufficient amount of heat is applied. Given that polyimide does not generally melt, a melting point of supporting layer BF may be lower than a melting point of flexible substrate TFS. As such, the material composition of flexible substrate TFS may be selected to prevent or at least reduce the potential of damage to at least one other component of flexible display panel 100 when the temperature of wire W is greater than 250° C. or supporting layer BF is removed and wire W interfaces with flexible substrate TFS.

In step 703, wire W is disposed on supporting layer BF. For instance, wire W is held under tension at an elevated temperature and pressed into supporting layer BF in the first portion of second non-display area NDA2, as seen in FIG. 8B. According to step 705, a material of supporting layer BF is thermally deformed, e.g., the material of supporting layer BF at least transitions from a solid phase to a liquid phase. That is, some material of the first portion of supporting layer BF melts. As a result of the melting, at least one material property of the some material of the first portion of supporting layer BF is modified. For instance, as seen in FIG. 10, bubbles (e.g., air bubbles) may be formed in the first portion of supporting layer BF, surface roughness of supporting layer BF may be modified, density of supporting layer BF may be changed, bumps in edges of supporting layer BF may be formed, traces of burns in surfaces of supporting layer BF may be identifiable, etc. It is also noted that the thermal deformation may cause, at least in part, hardness of a portion of supporting layer BF to be modified relative to other portions of supporting layer BF.

According to one or more exemplary embodiments, the thermal deformation of the first portion of supporting layer BF is also accompanied by dimensional changes in the first portion of supporting layer BF. For instance, wire W may move material from the first portion of supporting layer BF into another portion of supporting layer BF. This may form supporting layer portion ABF and/or remove supporting layer BF in a region where wire W is pressed into supporting layer BF. As can be appreciated by comparing FIGS. 9A and 9B, the dimensional changes in supporting layer portion ABF are less than dimensional changes in supporting layer portion $ABF_2$. This difference in dimensional change may be associated with a depth at which wire W is pressed into supporting layer BF and an amount of material of the first portion of second non-display area NDA2 is permitted to be displaced before the material transitions back into a solid phase. Further, the cross-sectional shape of wire W may be modified (that may also modify formation of supporting layer portion ABF), as can be appreciated from wire $W_2$ and supporting layer portion $ABF_3$ in FIG. 9C.

At step 707, a second portion of second non-display area NDA2 is bent with respect to display area DA, as seen in FIG. 8B. In one or more exemplary embodiments, the second portion of second non-display area NDA2 is bent such that surfaces of supporting layer BF oppose one another, as seen in FIG. 8C. It is noted that the second portion of second non-display area NDA2 may be bent while wire W is pressed into supporting layer BF or may be bent after removing wire W from supporting layer BF. According to one or more exemplary embodiments, the second portion of second non-display area NDA2 is bent within a determined time period of thermally deforming the first portion of second non-display area NDA2. For example, the second portion of second non-display area NDA2 is bent within 1 to 2 seconds of thermally deforming the first portion of second non-display area NDA2 or within 1 to 2 seconds of removing wire W from supporting layer BF. As seen in FIGS. 8B and 8C, the second portion of second non-display area NDA2 is bent while wire W is pressed into supporting layer BF.

In one or more exemplary embodiments, it is determined, per step 709, whether wire W is to be removed from flexible display panel 100. That is, whether wire W is to be removed from supporting layer BF after or while the second portion of second non-display area NDA2 is being bent. When wire W remains a part of flexible display panel 100, portions of wire W extending beyond lateral side surfaces of flexible display panel 100 may be cut from flexible display panel 100, in step 711. In those instances when wire W is to be removed, wire W is displaced from the first portion of second non-display area NDA2 and removed from flexible display panel 100, per step 713. As seen in FIG. 8D, wire W is removed from flexible display panel 100, such that trench G is formed. It is noted that surfaces of trench G may exhibit differences in surface roughness relative to other portions of supporting layer BF, as well as exhibit traces of burns, e.g., may appear to be charred, relative to the other portions of supporting layer BF. To this end, bubbles may be trapped near the surfaces of trench G.

According to one or more exemplary embodiments, flexible display panel 100 may be "hot" bent via a hot press bending technique, which is described in more detail in association with FIGS. 11, 12A, 12B, 13A-13C, 14A, 14B, 15A, and 15B. For instance, the second portion of second non-display area NDA2 may be bent from display area DA of flexible display panel 100 according to at least one hot press bending technique, e.g., at least one of the hot press bending techniques of FIGS. 11, 12A, 12B, 13A-13C, 14A, 14B, 15A, and 15B.

Figure 12A:
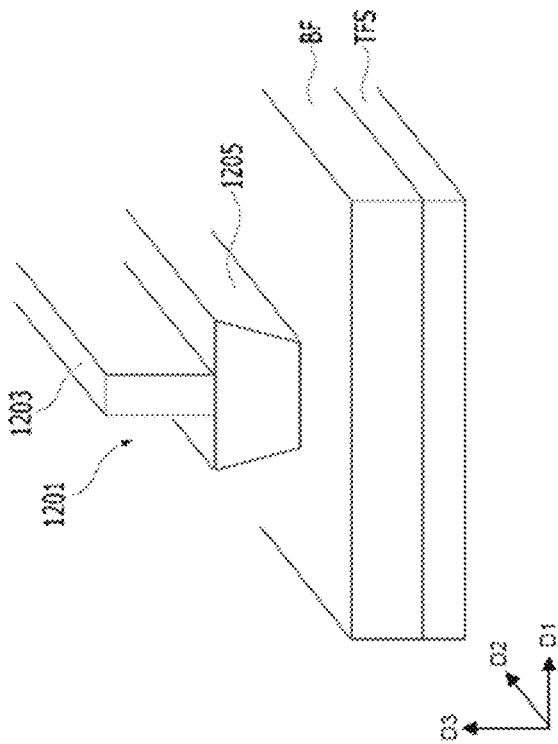
FIGS. 12A and 12B schematically illustrate various stages of a hot press bending technique, according to one or more exemplary embodiments.
Figure 12B:
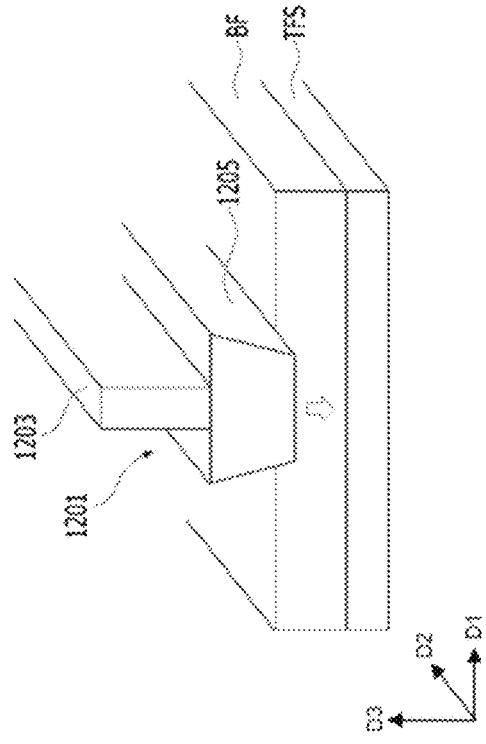
Figure 11:
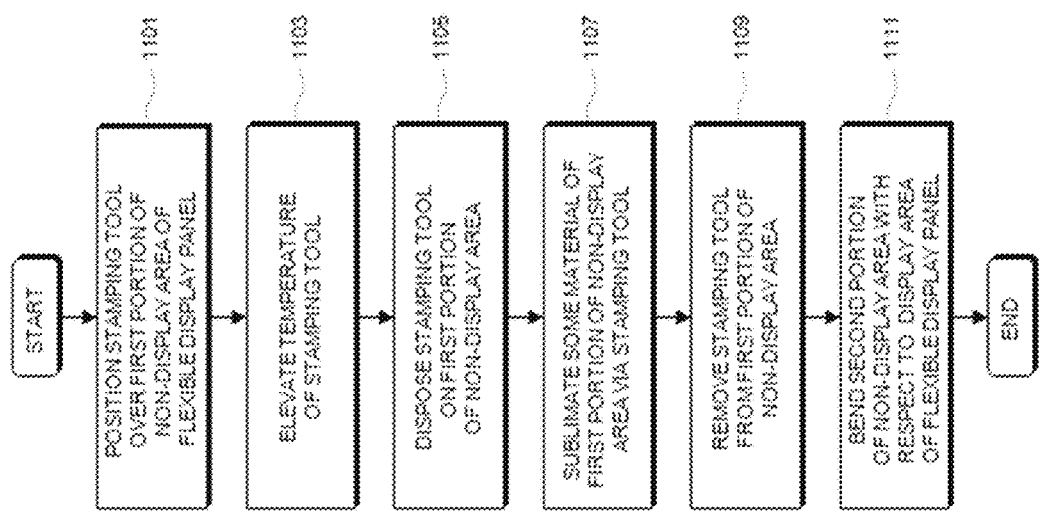
FIG. 11 is a flowchart of a process for bending a flexible display panel via a hot press bending technique, according to one or more exemplary embodiments.
Figure 13A:
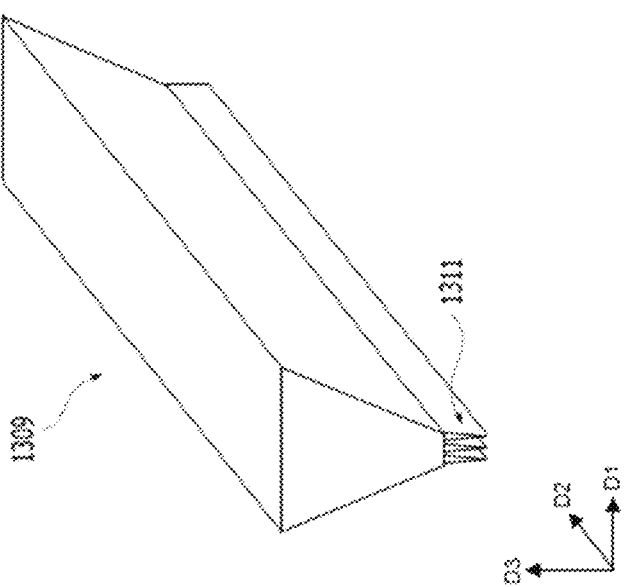
FIGS. 13A, 13B, and 13C schematically illustrate various hot press configurations, according to various exemplary embodiments.
Figure 13B:
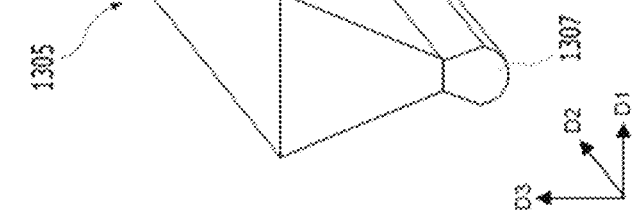
Figure 13C:
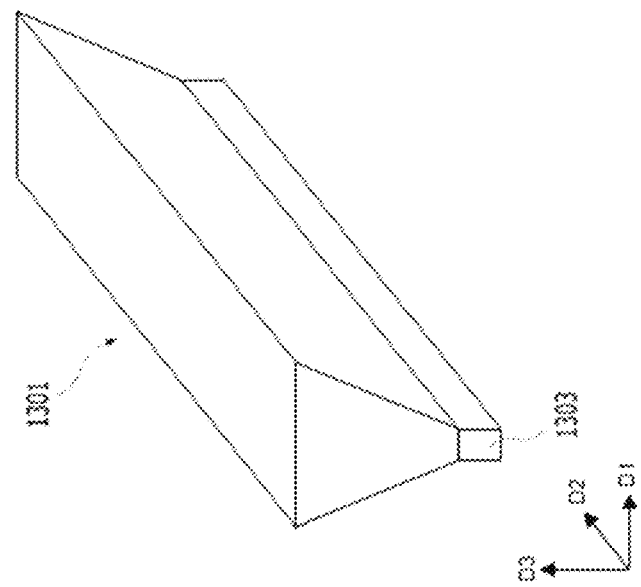

FIG. 11 is a flowchart of a process for bending a flexible display panel via a hot press bending technique, according to one or more exemplary embodiments. FIGS. 12A and 12B schematically illustrate various stages of a hot press bending technique, according to one or more exemplary embodiments. FIGS. 13A, 13B, and 13C schematically illustrate various hot press configurations, according to various exemplary embodiments. FIGS. 14A, 14B, 15A, and 15B schematically illustrate flexible display panels at various stages of hot press bending techniques, according to various exemplary embodiments.

In step 1101, stamping tool 1201 is positioned over the first portion of second non-display area NDA2 of flexible display panel 100, as seen in FIG. 12A. In one or more exemplary embodiments, supporting layer BF may face stamping tool 1201. That is, supporting layer BF may be disposed between stamping tool 1201 and flexible substrate TFS. It is noted that supporting layer BF may be formed of PET having a glass transition temperature around 76° C., a melting temperature around 250° C., and a decomposition temperature around 350° C. To this end, flexible substrate TFS may be formed of PI having a decomposition temperature around 452° C. when heat is applied continuously and a decomposition temperature around 704° C. when heat is applied in relatively short bursts of time.

As seen in FIG. 12A, stamping tool 1201 at least includes portion 1203 extending from main body portion 1205. Main body portion 1205 is formed of any suitable material composition configured to withstand temperatures greater than or equal to the decomposition temperature of the material composition of supporting layer BF and less than or equal to the decomposition temperature of the material composition of flexible substrate TFS. For instance, main body portion 1205 may be configured to withstand temperatures greater than or equal to 350° C., such as greater than or equal to 350° C. and less than or equal to 700° C., e.g., greater than or equal to 350° C. and less than or equal to 450° C. Although not illustrated in FIG. 12A, main body portion 1205 may extend (e.g., longitudinally extend) in second direction D2 to stamp a portion of supporting layer BF overlapping bending axis BX illustrated in FIGS. 1 and 2.

According to one or more exemplary embodiments, main body portion 1205 may include and be configured to transfer thermal energy to at least one thermal concentration portion configured to concentrate thermal energy received from main body portion 1205. For example, stamping tool 1301 includes quadrilateral thermal concentration portion 1303, as seen in FIG. 13A. FIG. 13B illustrates stamping tool 1305 including generally hemispherical concentration portion 1307, whereas FIG. 13C illustrates stamping tool 1309 including an array of triangular thermal concentration portions 1311. It is contemplated, however, that any suitable arrangement, configuration, and number of thermal concentration portions may be utilized. To this end, it is noted that the shape of main body portion 1205, the shape of thermal concentration portions, and the number of thermal concentration portions may be modified to achieve different bending radii of the second portion of second non-display area NDA2. In other words, different configurations of stamping tool 1201 may be utilized to alter the amount of stress reduction in flexible display panel 100 when flexible display panel 100 is bent about bending axis BX.

At step 1103, the temperature of main body portion 1205 of stamping tool 1201 is elevated. When the stamping tool includes at least one thermal concentration portion, elevation of the temperature of main body portion 1205 will cause thermal energy to be concentrated in the at least one thermal concentration portions. In one or more exemplary embodiments, the temperature of main body portion 1205 is elevated greater than or equal to the decomposition temperature of the material composition of supporting layer BF and less than or equal to the decomposition temperature of the material composition of flexible substrate TFS, such as greater than or equal to 350° C. and less than or equal to 700° C., e.g., greater than or equal to 350° C. and less than or equal to 450° C., for instance, 400° C. When the temperature of main body portion less than the decomposition temperature of the material composition of supporting layer BF, sublimation of at least one portion of second non-display area NDA2 may not be achieved. When the temperature of main body portion 1205 is greater than the decomposition temperature of the material composition of flexible substrate TFS, at least one other component of flexible display panel 100 may be damaged, such as flexible substrate TFS. This may compromise the structural integrity of flexible display panel 100, as well as introduce at least one defect affecting display quality.

In step 1105, stamping tool 1201 is disposed on supporting layer BF. For instance, stamping tool 1201 is held at an elevated temperature and pressed into supporting layer BF in the first portion of second non-display area NDA2, as seen in FIG. 12B. According to step 1107, a material of supporting layer BF is thermally deformed, e.g., the material of supporting layer BF at least transitions into a gaseous phase. That is, some material of the first portion of supporting layer BF sublimates. As a result of the sublimation, at least one trench is formed in the first portion of supporting layer BF and at least one material property of other material disposed relatively closer to surfaces of the at least one trench is modified.

Figure 14A:
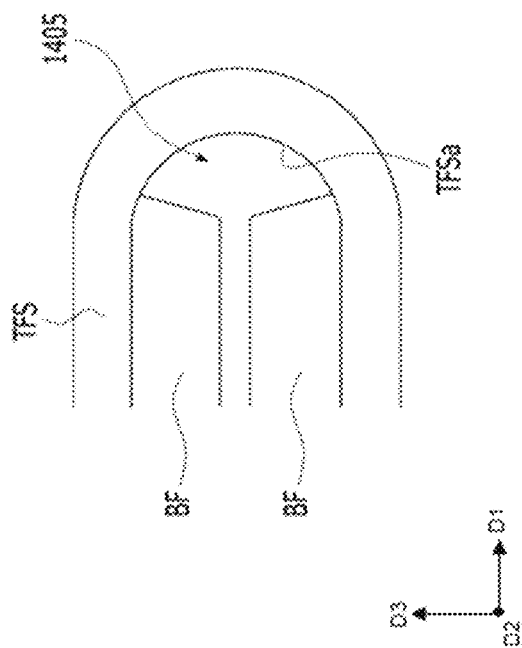
FIGS. 14A and 14B schematically illustrate a flexible display panel at various stages of a hot press bending technique, according to one or more exemplary embodiments.
Figure 14B:
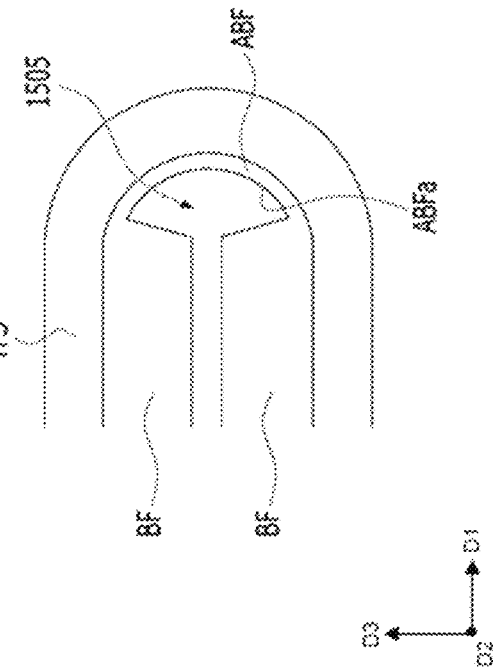
Figure 15A:
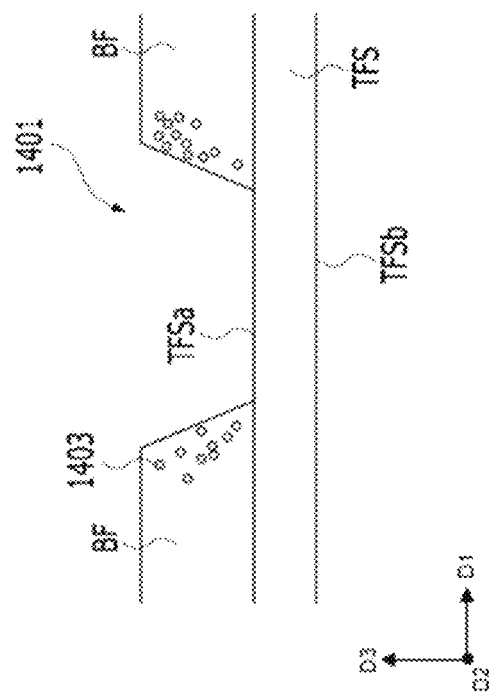
FIGS. 15A and 15B schematically illustrate a flexible display panel at various stages of a hot press bending technique, according to one or more exemplary embodiments.

For instance, as seen in FIGS. 14A and 14B, trenches 1401 and 1501 may be formed and bubbles (e.g., air bubbles) 1403 and 1503 may be trapped relatively closer to surfaces of trenches 1401 and 1501 than other portions of supporting layer BF. As seen in FIG. 14A, trench 1401 exposes first surface TFSa of flexible substrate TFS opposing second surface TFSb of flexible substrate TFS. In FIG. 15A, formation of trench 1501 via stamping tool 1201 enables formation of supporting layer portion ABF including surface ABFa opposing second surface TFSb of flexible substrate TFS. Although not shown in FIGS. 14A and 14B, sublimation of the some material of the first portion of supporting layer BF may also cause, at least in part, surface roughness of a portion of supporting layer BF to be modified, density of a portion of supporting layer BF to be changed, bumps in edges of a portion of supporting layer BF to be formed, color differences in a portion of supporting layer BF to be generated, etc. It is also noted that the thermal deformation may cause, at least in part, hardness of a portion of supporting layer BF to be modified relative to other portions of supporting layer BF.

Figure 15B:
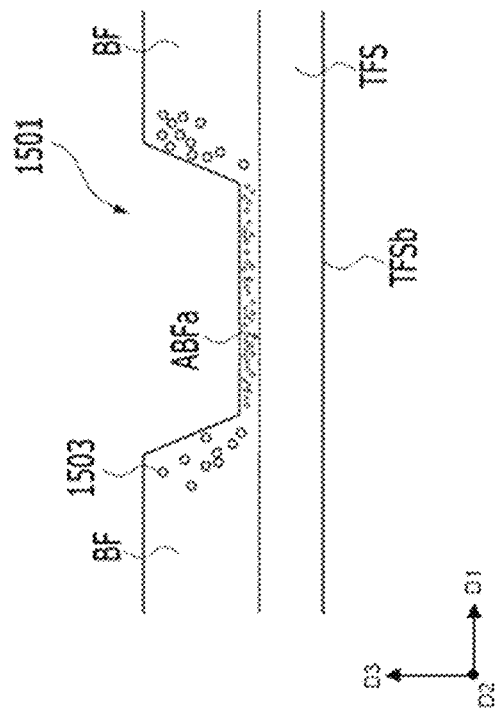

At step 1109, stamping tool 1201 is removed from the first portion of second non-display area NDA2, as seen in FIGS. 14A and 14B. Within a determined period of time of thermally deforming the first portion of second non-display area NDA2, a second portion of second non-display area NDA2 is bent with respect to display area DA of flexible display panel 100, per step 1111. For example, the second portion of second non-display area NDA2 is bent within 1 to 2 seconds of thermally deforming the first portion of second non-display area NDA2 or within 1 to 2 seconds of removing stamping tool 1201 from supporting layer BF. As seen in FIGS. 14B and 15B, cavity regions 1405 and 1505 may be formed in association with bending the second portion of second non-display area NDA2. Although FIGS. 14B and 15B illustrate bending radii in which opposing surfaces of supporting layer BF are not in contact with one another, it is contemplated that opposing surfaces of supporting layer BF may be in contact. As such, a bending radius of flexible display panel 100 may be greater than or equal to twice the thickness of supporting layer BF, such as greater than or equal to about 200 μm. Larger bending radii may be formed in association with exemplary embodiments.

According to one or more exemplary embodiments, at least one of the hot wire and hot press bending techniques may be utilized to form a pattern of thermal deformations in support layer BF that may further reduce mechanical stress on flexible display panel 100 when flexible display panel 100 is bent. An exemplary pattern of thermal deformations to flexible display panel 100 is described in more detail in association with FIGS. 16A and 16B.

Figure 16A:
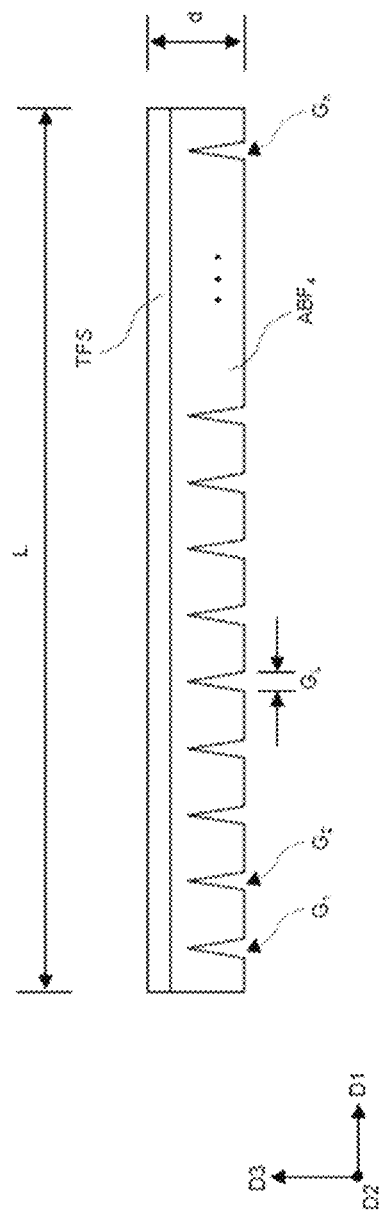
FIGS. 16A and 16B schematically illustrate a flexible display panel at various stages of being bent, according to one or more exemplary embodiments.
Figure 16B:
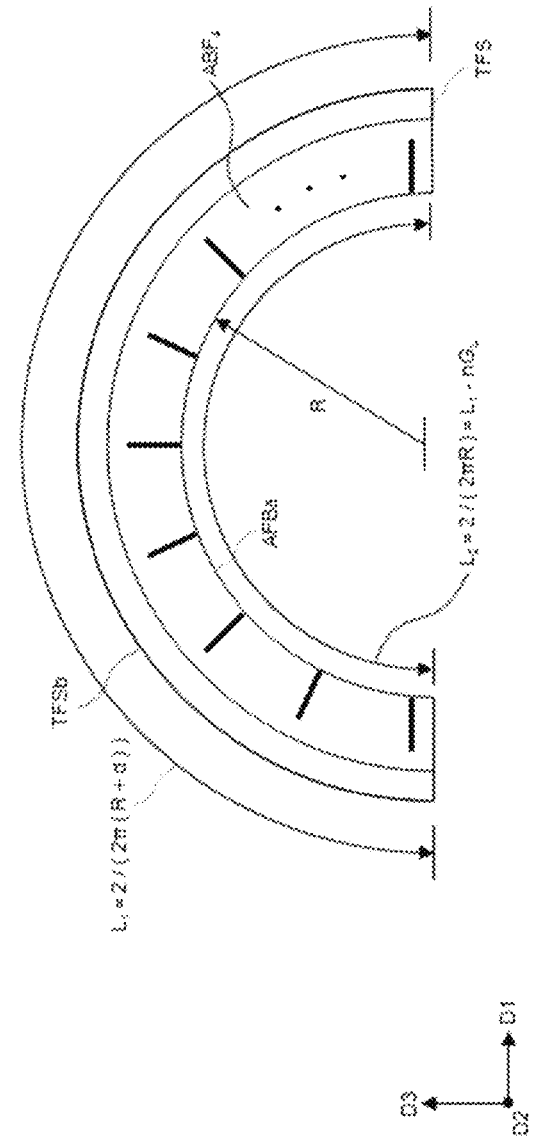

FIGS. 16A and 16B schematically illustrate a flexible display panel at various stages of being bent, according to one or more exemplary embodiments.

As seen in FIG. 16A, a pattern of thermal deformations (e.g., a pattern of trenches $G_1$ to $G_n$, n being a natural number greater than 1) are formed in supporting layer portion $ABF_4$ of a flexible display panel, such as flexible display panel 100 of FIG. 1. Each trench may exhibit a maximum length in first direction D1 of $G_L$. To this end, supporting layer portion $ABF_4$ includes a length L, and an aggregate thickness of the flexible display panel in association with supporting layer portion $ABF_4$ is d. In one or more exemplary embodiments, removal of material of supporting layer portion $ABF_4$ enables the flexible display device to be more easily bent at least because less material is structurally deformed and because the bending of the flexible display device occurs while the temperature of supporting layer portion $ABF_4$ is raised.

Referring to FIG. 16B, bending of the flexible display panel may cause at least some of trenches $G_1$ to $G_n$ to close, such that length $L_1$ of second surface $TFS_b$ of flexible substrate TFS is longer than length $L_2$ of surface ABFa of supporting layer portion $ABF_4$. For instance, length $L_1$ may be determined according to Equation 1, whereas length $L_2$ may be determined according to Equation 2.

$$L_1=2/(2\pi(R+d)) \qquad \text{Eq. 1}$$

$$L_2=2/(2\pi R)=L_1-nG_L \qquad \text{Eq. 2}$$

It is noted that $L_1$ =the length of second surface TFSb of flexible substrate TFS; $L_2$ =the length of surface ABFa of supporting layer portion ABF4; R=the bend radius of the flexible display device; $G_L$ =trench width in first direction D1; n=the number of trenches formed in supporting layer portion ABF4; and d=the aggregate thickness of flexible substrate TFS and supporting layer portion $ABF_4$.

To reduce mechanical stress in flexible display panel 100 when, for instance, the second portion of second non-display area NDA2 is bent from display area DA, a "notching" technique may be may be employed to remove material in a first portion of second non-display area NDA2. It is noted that the "notching" technique may also heat a third portion of supporting layer BF to enable opposing surfaces of supporting layer BF to be coupled together without use of a separate adhesive component, such as a separate OCA, PSA, etc. An exemplary "notching" technique is described in more detail in association with FIGS. 17, 18A, and 18B.

Figure 18A:
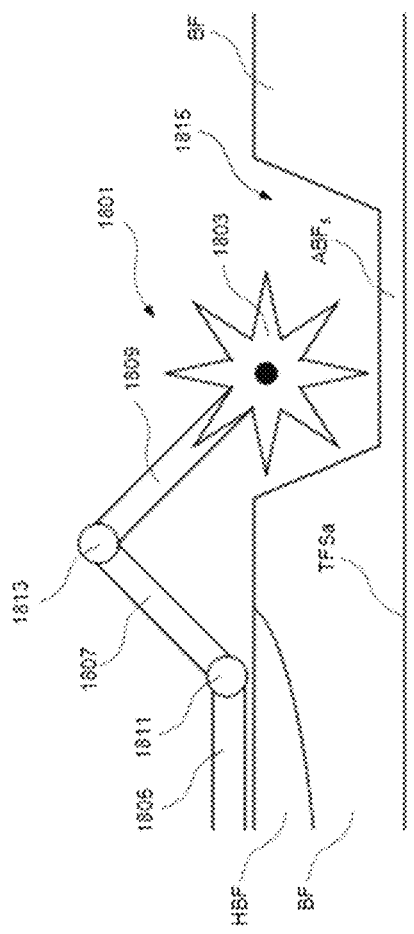
FIGS. 18A and 18B schematically illustrate a flexible display panel at various stages of being bent, according to one or more exemplary embodiments.
Figure 18B:
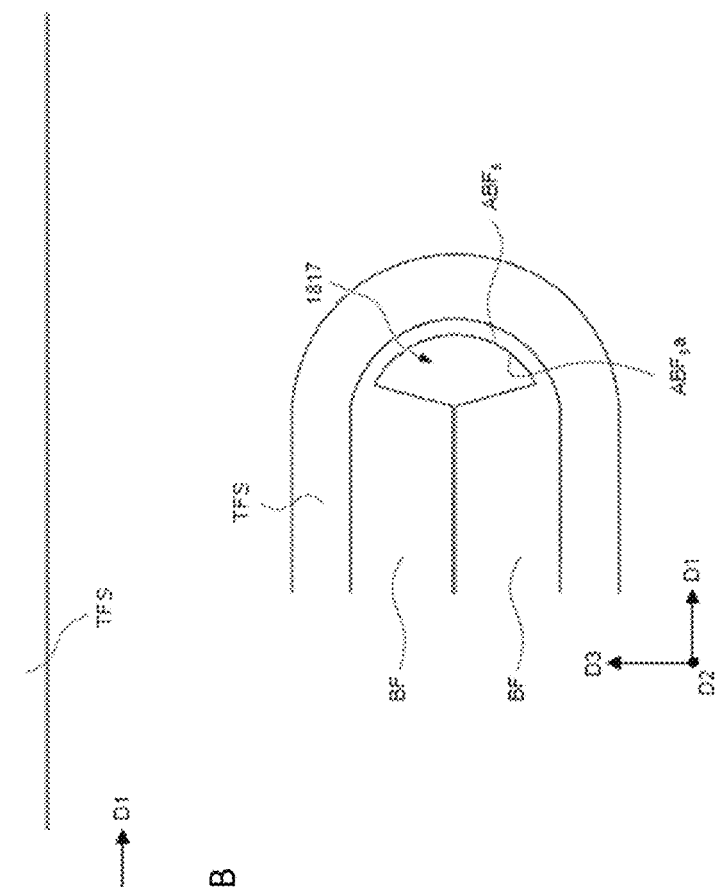
Figure 17:
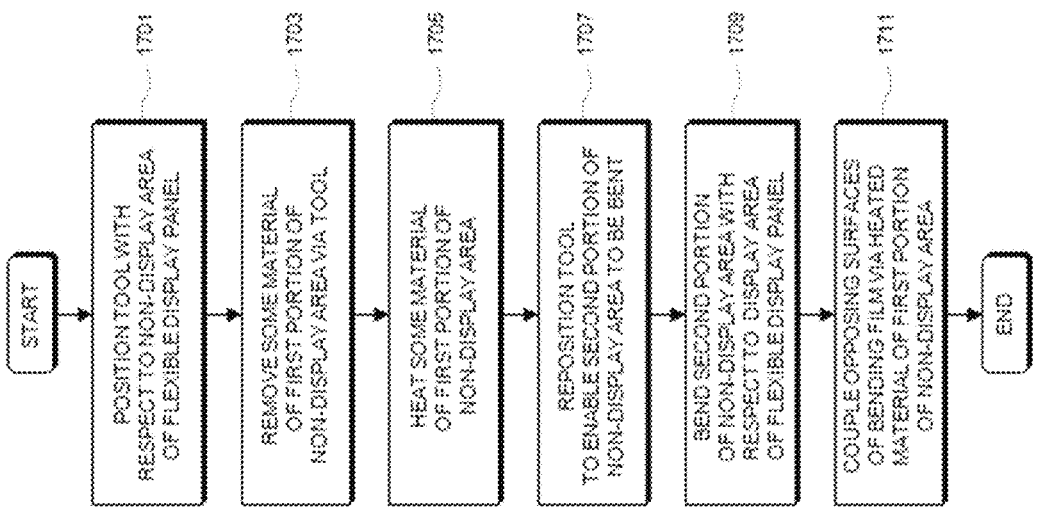
FIG. 17 is a flowchart of a process for bending a flexible display panel, according to one or more exemplary embodiments.

FIG. 17 is a flowchart of a process for bending a flexible display panel, according to one or more exemplary embodiments. FIGS. 18A and 18B schematically illustrate a flexible display panel at various stages of being bent, according to one or more exemplary embodiments.

In step 1701, cutting tool 1801 is positioned over the first portion of second non-display area NDA2 of flexible display panel 100. In one or more exemplary embodiments, supporting layer BF may face cutting tool 1801. That is, supporting layer BF may be disposed between cutting tool 1801 and flexible substrate TFS. It is also noted that supporting layer BF may be formed of PET having a glass transition temperature around 76° C., a melting temperature around 250° C., and a decomposition temperature around 350° C. To this end, flexible substrate TFS may be formed of PI having a decomposition temperature around 452° C. when heat is applied continuously and a decomposition temperature around 704° C. when heat is applied in relatively short bursts of time.

At step 1703, cutting tool 1801 is manipulated to remove some material from the first portion of second non-display area NDA2, as seen in FIG. 18A. For instance, cutting tool 1801 may include cutting wheel 1803 supported via one or more articulations (e.g., articulations 1805, 1807, and 1809) that may be connected to one another via one or more joints (e.g., joints 1811 and 1813). In this manner, manipulation of the one or more articulations, the one or more joints, and cutting wheel 1803 may enable trench 1815 to be formed in supporting layer BF. To this end, formation of trench 1815 may or may not expose first surface TFSa of flexible substrate TFS. As seen in FIG. 18A, supporting layer portion $ABF_5$ is formed, such that first surface TFSa is not exposed, but instead, is covered by supporting layer portion $ABF_5$ including surface $ABF_5$a opposing first surface TFSa of flexible substrate TFS.

Manipulation of cutting tool 1801 may cause one or more third portions HBF of supporting layer BF to be heated, per step 1705. For instance, rotation of articulation 1805 to rotate cutting wheel 1803 may cause third portion HBF to heat according to friction between supporting layer BF and articulation 1805. Heating of third portion HBF may transition at least some of the material of third portion HBF to a liquid phase, as well as thermally deform at least some of third portion HBF. As a result of the thermal deformation, at least one material property of the some material of the third portion HBF may be modified, such as previously described in association with FIGS. 7 and 10. It is also noted that the thermal deformation may cause, at least in part, hardness of a portion of supporting layer BF to be modified relative to other portions of supporting layer BF.

In step 1707, cutting tool 1707 is repositioned to enable a second portion of second non-display area NDA2 to be bent. At step 1709, the second portion of second non-display area NDA2 is bent with respect to display area DA, as seen in FIG. 18B. In one or more exemplary embodiments, the second portion of second non-display area NDA2 is bent such that surfaces of supporting layer BF oppose one another and contact one another. According to one or more exemplary embodiments, the second portion of second non-display area NDA2 is bent within a determined time period of thermally deforming third portion HBF of second non-display area NDA2. For example, the second portion of second non-display area NDA2 is bent within 1 to 2 seconds of thermally deforming third portion HBF or within 1 to 2 seconds of repositioning cutting tool 1801. As seen in FIG. 18B, cavity region 1817 may be formed in association with bending the second portion of second non-display area NDA2. As such, a bending radius of the flexible display panel may be greater than or equal to twice the thickness of supporting layer BF, such as greater than or equal to about 200 μm. It is noted, however, that larger bending radii may be formed in association with exemplary embodiments.

As previously mentioned, bending of the second portion of second non-display area NDA2 causes surfaces of supporting layer BF to oppose and contact one another. Given that bending occurs relatively shortly after elevating the temperature of third portion HBF, then the contacting surfaces of supporting layer HBF may be coupled to one another as third portion HBF cools, per step 1711. In other words, the liquid phase of third portion HBF may solidify to couple contacting surfaces of supporting layer BF to one another. As such, a separate adhesive component, e.g., an OCA, a PSA, etc., may be omitted. Moreover, given that bending occurs relatively shortly after elevating the temperature of third portion HBF and given the presence of trench 1815, the flexible display panel may be bent with less force than would otherwise be required, and, as such, less stress is generated.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A method of bending a flexible display panel including a flexible substrate extending from a display area to a non-display area and a support layer disposed on the flexible substrate in the display area and the non-display area, the method comprising:

altering, via thermal deformation, a property of a material of the support layer disposed on the flexible substrate in the non-display area of the flexible display panel; and bending, after altering the property, a portion of the support layer in non-display area that extends from a plane of the support layer in the display area of the flexible display panel.

2. The method of claim 1, wherein the property corresponds to at least one of a density of the material, a hardness of the material, a surface roughness of the material, and a color of the material.

3. The method of claim 1, wherein the thermal deformation includes melting portions of the material of the support layer in the non-display area.

4. The method of claim 3, further comprising:
disposing a wire on the support layer in the non-display area,
wherein the disposing of the wire causes, at least in part, the melting of the portions of the material of the support layer in the non-display area.

5. The method of claim 1, wherein the thermal deformation corresponds to a sublimation of some of the material of the support layer in the non-display area.

6. The method of claim 5, further comprising:
disposing a stamp on the support layer in the non-display area,
wherein the disposing of the stamp causes, at least in part, some of the material of the support layer to sublimate in the non-display area.

7. The method of claim 1, further comprising:
removing, via a rotational cutting tool, a first portion of the support layer disposed in the portion of the non-display area,
wherein rotation of the rotational cutting tool causes, at least in part, the thermal deformation in a second portion of the support layer.

8. The method of claim 7, wherein:
bending the portion of the non-display area causes opposing surfaces of the non-display area to contact one another, at least one of the opposing surfaces being associated with the second portion of the support layer; and
the opposing surfaces are coupled to one another via cooling of the second portion.

* * * * *